United States Patent
Mantiply et al.

(10) Patent No.: US 10,096,582 B2
(45) Date of Patent: Oct. 9, 2018

(54) ENHANCED POWER DISTRIBUTION TO APPLICATION SPECIFIC INTEGRATED CIRCUITS (ASICS)

(71) Applicant: Cisco Technology, Inc., San Jose, CA (US)

(72) Inventors: Paul L. Mantiply, Mountain View, CA (US); Straty Argyrakis, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/205,702

(22) Filed: Jul. 8, 2016

(65) Prior Publication Data
US 2018/0012879 A1    Jan. 11, 2018

(51) Int. Cl.
*H05K 7/10*    (2006.01)
*H01L 25/18*    (2006.01)
(Continued)

(52) U.S. Cl.
CPC .......... *H01L 25/18* (2013.01); *H01L 23/3675* (2013.01); *H01L 23/49827* (2013.01);
(Continued)

(58) Field of Classification Search
CPC ............. H01L 21/563; H01L 23/3675; H01L 23/3677; H01L 23/49827; H01L 23/5383; H01L 23/5384; H01L 23/5389; H01L 25/16; H01L 25/18; H01L 25/50; H01L 25/0657; H01L 24/17; H01L 2924/10253; H01L 2924/10329; H01L 2924/1033; H01L 2924/1306; H01L 2924/1426; H01L 2924/1427; H01L 2924/1433; H01L 2924/01079; H01L 2924/15311; H01L 2924/19041; H01L 2924/19042; H01L 2924/19102; H01L 2224/16225;
(Continued)

(56) References Cited

U.S. PATENT DOCUMENTS 5,754,605 A * 5/1998 Chong ................... H04L 1/0057
                                                    370/514
5,833,471 A * 11/1998 Selna ..................... H05K 3/325
                                                    439/73
(Continued)

OTHER PUBLICATIONS

Snva586_Power Management Considerations for FPGAs and ASICs_2011.*

*Primary Examiner* — Timothy Thompson
*Assistant Examiner* — Guillermo Egoavil
(74) *Attorney, Agent, or Firm* — Edell, Shapiro & Finnan, LLC

(57) ABSTRACT

Presented herein is a method and apparatus for enhanced power distribution to application specific integrated circuits (ASICs). The apparatus includes a substrate, an ASIC, and a voltage regulator module. The substrate includes a first side, a second side, and a vertical interconnect access (via) extending between the first side and the second side. The ASIC is mounted on the first side of the substrate in alignment with the via. The voltage regulator module is mounted on the second side of the substrate in alignment with the via so that the voltage regulator module is electrically coupled to the ASIC through the via.

20 Claims, 6 Drawing Sheets

(51) Int. Cl.
| | |
|---|---|
| *H02M 3/158* | (2006.01) |
| *H01L 23/498* | (2006.01) |
| *H05K 1/11* | (2006.01) |
| *H05K 1/18* | (2006.01) |
| *H01L 25/16* | (2006.01) |
| *H01L 23/538* | (2006.01) |
| *H05K 1/02* | (2006.01) |
| *H01L 23/367* | (2006.01) |
| *H01L 25/00* | (2006.01) |
| *H05K 3/34* | (2006.01) |
| *H01L 23/00* | (2006.01) |

(52) U.S. Cl.
CPC ...... *H01L 23/5383* (2013.01); *H01L 23/5384* (2013.01); *H01L 23/5389* (2013.01); *H01L 25/16* (2013.01); *H01L 25/50* (2013.01); *H02M 3/158* (2013.01); *H05K 1/0204* (2013.01); *H05K 1/0298* (2013.01); *H05K 1/115* (2013.01); *H05K 1/181* (2013.01); *H05K 1/185* (2013.01); *H05K 3/341* (2013.01); *H05K 3/3436* (2013.01); *H01L 24/17* (2013.01); *H01L 2924/1033* (2013.01); *H01L 2924/10253* (2013.01); *H01L 2924/10329* (2013.01); *H01L 2924/1306* (2013.01); *H01L 2924/1426* (2013.01); *H01L 2924/1427* (2013.01); *H01L 2924/1433* (2013.01); *H01L 2924/15311* (2013.01); *H01L 2924/19041* (2013.01); *H01L 2924/19042* (2013.01); *H01L 2924/19102* (2013.01); *H05K 2201/1003* (2013.01); *H05K 2201/10015* (2013.01); *H05K 2201/10166* (2013.01); *H05K 2201/10378* (2013.01); *H05K 2201/10545* (2013.01); *H05K 2201/10734* (2013.01)

(58) Field of Classification Search
CPC . H01L 2224/16227; H01L 2224/16235; H01L 2224/16237; H01L 2224/32225; H01L 2224/73203; H01L 2224/73204; H01L 2225/06517; H01L 2225/06572; H02M 3/158; H05K 1/182; H05K 1/0204; H05K 1/0262; H05K 1/0298; H05K 1/115; H05K 1/181; H05K 1/185; H05K 3/341; H05K 3/3436; H05K 2201/09072; H05K 2201/10015; H05K 2201/1003; H05K 2201/10166; H05K 2201/10378; H05K 2201/10545; H05K 2201/10734
USPC .......... 361/767; 257/780, E25.013, E21.503, 257/773; 438/107, 613
See application file for complete search history.

(56) References Cited

U.S. PATENT DOCUMENTS

| | | | |
|---|---|---|---|
| 6,689,634 B1* | 2/2004 | Lyne | H01L 23/49838 257/E23.07 |
| 7,185,821 B1 | 3/2007 | Camerlo et al. | |
| 8,692,368 B2 | 4/2014 | Pan et al. | |
| 2003/0111709 A1* | 6/2003 | Lin | H01L 23/49589 257/532 |
| 2008/0002380 A1 | 1/2008 | Hazucha et al. | |
| 2008/0116589 A1* | 5/2008 | Li | H01L 21/563 257/780 |
| 2009/0175012 A1* | 7/2009 | Frasco | H05K 1/184 361/762 |
| 2010/0148344 A1 | 6/2010 | Chandra et al. | |
| 2011/0050334 A1 | 3/2011 | Pan et al. | |
| 2011/0215863 A1 | 9/2011 | Pan et al. | |
| 2011/0317383 A1* | 12/2011 | Guzek | H01L 24/24 361/764 |
| 2011/0317837 A1 | 12/2011 | Pan et al. | |
| 2016/0211190 A1* | 7/2016 | Braunisch | H01L 21/52 |

* cited by examiner

US 10,096,582 B2

ENHANCED POWER DISTRIBUTION TO APPLICATION SPECIFIC INTEGRATED CIRCUITS (ASICS)

TECHNICAL FIELD

The present disclosure relates to power delivery and, in particular, to enhancing power delivery to application specific integrated circuits (ASICs).

BACKGROUND

As application specific integrated circuit (ASIC) process nodes advance, and device currents continue to scale in support of ever higher very large scale integration (VLSI) gate counts, delivering, or ensuring the delivery of, the requisite power to ASICs is becoming a significant challenge. In particular, noise specifications are becoming increasingly difficult to satisfy. As an example, the power delivery must account for voltage droops (e.g., the intentional loss in output voltage from a device as it drives a load) driven by current consumption, while voltage droop budgets (e.g., the amount of voltage droop that can be accommodated without negatively impacting power delivery) are decreasing with decreases in operating voltages of ASICs. Moreover, current consumption only increases as the device count increases, thereby increasing the difficulty of delivering the requisite power (e.g., clean power) to ASIC devices. More specifically, reduced operating voltage linearly reduces allowable voltage droop while increasing current demand linearly increases actual voltage droop. Consequently, an alternate approach to power distribution is needed.

DESCRIPTION OF EXAMPLE EMBODIMENTS

Overview

Figure 1:
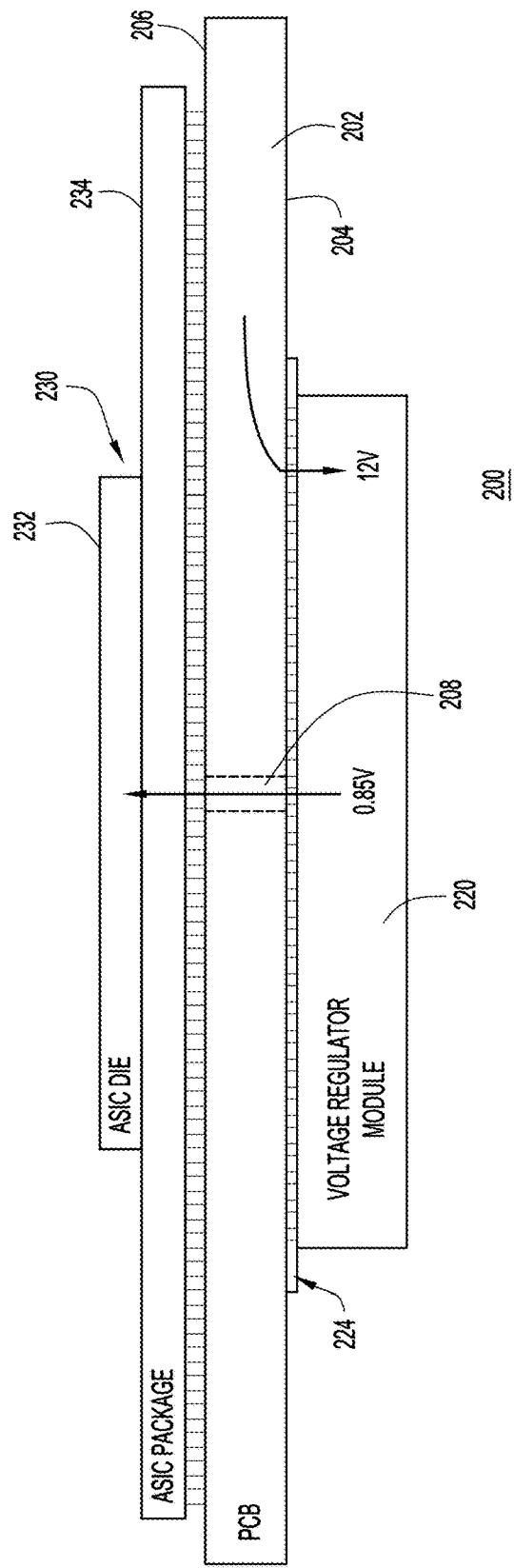
FIG. 1 is a combined sectional view and representative schematic diagram of an apparatus for enhancing power delivery to an application-specific integrated circuit (ASIC), according to an example embodiment.

Presented herein is a method and apparatus for enhanced power distribution to application specific integrated circuits (ASICs). According to one example embodiment, the apparatus includes a substrate, an ASIC, and a voltage regulator module. The substrate includes a first side, a second side, and a vertical interconnect access (via) extending between the first side and the second side. The ASIC is mounted on the first side of the substrate in alignment with the via. The voltage regulator module is mounted on the second side of the substrate in alignment with the via so that the voltage regulator module is electrically coupled to the ASIC through the via.

According to another example embodiment, a method for enhancing power distribution to ASICs includes providing a substrate with a first side, a second side, and a vertical interconnect access (via) extending between the first side and the second side. An ASIC is mounted on the first side of the substrate in alignment with the via and a voltage regulator module is mounted to the second side of the substrate in alignment with the via so that the voltage regulator module is electrically coupled to the ASIC through the via.

According to yet another example embodiment, an apparatus for enhanced power distribution to ASICs includes a printed circuit board (PCB) with a preexisting vertical interconnect access (via) and a voltage regulator module. The voltage regulator module is integrated into the PCB in a shadow of an ASIC that is aligned with the preexisting via.

Example Embodiments

Presented herein are a method and apparatus for enhancing power distribution to application specific integrated circuits (ASICs). The method and apparatus enhance the power delivery by vertically aligning a voltage regulator module with an ASIC. When aligned, the voltage regulator module is electrically connected to the ASIC through a vertical interconnect access (via) in the PCB and, thus, the connection requires minimal or no (if the via is a preexisting via) modifications to the PCB. As is described in further detail below, this vertical alignment increases power efficiency and transient performance while allowing for increased printed circuit board (PCB) density. These improvements allow for continued scaling of port density and improvement in power efficiency. For example, vertical alignment reduces the voltage droop of power delivered from the voltage regulator to the ASIC while also freeing up valuable area on a PCB disposed between the ASIC and the voltage regulator. Moreover, vertical alignment allows for power to be delivered to an ASIC, or portions thereof, at multiple voltages.

By comparison, typically, a voltage regulator module (VRM) is mounted in horizontal alignment with an ASIC on the top side of a PCB. When the VRM is horizontally aligned with the ASIC 130 in this manner, power must be distributed through traces in PCB planes in order to distribute power from the VRM to the ASIC. However, the plane region in the ASIC shadow is typically heavily perforated by through-hole-vias and, thus, as power travels through the PCB, there may be a significant voltage drop across the PCB (e.g., a significant IR-drop). Consequently, a direct current (DC) set-point needs to be set high enough to guarantee ASIC specifications are met despite the voltage drop, which results in increased static and dynamic power dissipation. In other words, additional power (in addition to the power required by the ASIC) must be supplied by the VRM to satisfy noise constraints for power delivery to ASIC (e.g., to create a higher margin for voltage droop). However, this additional power may result in wasted power.

Additionally, delivering power horizontally (or laterally) through a PCB consumes valuable PCB resources in terms of both PCB area and copper layers, thereby limiting PCB density. For example, multiple layers may be required to achieve the low impedance demanded by noise specifications for core power rails and/or a dedicated PCB power plane may be required for high current input/output (IO), such as Serializer/Deserializer (SERDES). In some instances, power is regulated on a per-slice basis; however, this method also consumes significant PCB area. Moreover, split rail ASICs, which offer a potential path to lower power devices, often cannot be supported due to PCB restrictions. Still further, there may also be a significant amount of heat dissipation and poor transient performance (because the VRM is inductively far away from the load), which may require additional bypass capacitors to be included in the PCB.

For the purposes of this application, vertically aligning or sandwiching a voltage regulator module and ASIC around a PCB may be referred to as a clamshell configuration. Moreover, for the purposes of this application a voltage regulator that is vertically aligned with an ASIC may be referred to as being in the shadow of the ASIC, longitudinally aligned with the ASIC, or any variations thereof. Additionally, for ease of description, terms such as "left," "right," "top," "bottom," "front," "rear," "side," "height," "length," "width," "upper," "lower," "interior," "exterior," "inner," "outer," "forward," "rearward," "upwards," "downwards," and the like as may be used herein, merely describe points or portions of reference and do not limit the examples presented to any particular orientation or configuration. Further, terms such as "first," "second," "third," etc., merely identify one of a number of portions, components and/or points of reference as disclosed herein, and do not limit the examples presented herein to any particular configuration or orientation.

Referring to FIG. 1 for a description of an electrical apparatus 200 with enhanced power distribution in accordance with an example embodiment. Electrical apparatus 200 includes a PCB 202 with a first (bottom) side 204 and a second (top) side 206; however, in contrast with conventional designs (e.g., horizontally aligned VRM and ASIC), a fully integrated VRM 220 is mounted on the bottom side 204 in alignment with an ASIC 230 mounted on the top side 206 (the ASIC 230 includes an ASIC package 234 and an ASIC die 232 thereabove). This design makes use of the ASIC shadow, or clamshell space, on the backside of the PCB, which is typically 55 mm×55 mm in area and 3-4 mm in height. This space is usually only used for decoupling capacitors, so using this space for the VRM 220 achieves the power regulation in unused space, freeing up both real estate and layer resources in the PCB 202. Additionally, locating the VRM 220 in this location allows power from the VRM 220 to be run vertically to the ASIC 230, through a via 208 included in the PCB 202, such that power does not need to be distributed along a highly perforated power plane. Consequently, valuable layers in the PCB 202 as well as valuable real estate on the layers can be freed up or removed to improve product density. For example, PCB layer count may be able to be reduced (depending on the constraints of the rest of the PCB) if the power planes to support the ASIC are eliminated.

In at least one embodiment, the via 208 is a preexisting feature included in the PCB 202 by design (sometimes referred to as a through-hole-via). The path provided by via 208 provides lower loss (compared to a path on a perforated power plane) because there are no perforations along the path causing dissipation. In some embodiments, the vertical path provided by via 208 may provide a 10-15% decrease in power dissipation compared to traces on a power plane. It also has lower inductance, resulting in superior transient performance. Lower loss and lower inductance create significantly smaller voltage droop, as is described further below in connection with FIGS. 4 and 5, which, in turn, allows the nominal ASIC voltage to be reduced and creates significant savings.

In some embodiments, the VRM 220 is mounted to the PCB 202 by integrating the VRM 220 into a PCB stiffener and/or heat sink support included in the PCB 202. Additionally or alternatively, the VRM 220 may be mounted to the PCB 202 with an elastomeric membrane connector, such as a silicone-rubber membrane, and/or by soldering the VRM 220 to the PCB 202, such as with a ball grid array (BGA). Regardless of how the VRM 220 is mounted to the PCB 202, the VRM 220 is only separated from the ASIC 230 by the height of the PCB 202, which may be approximately 4-5 mm, thereby minimizing noise and power dissipation between the VRM 220 and the ASIC 230.

Additionally, when mounted to the second side 204 of the PCB 202, the VRM 220 interfaces to the backside of the ASIC 230 through the via 208 included in the PCB 202 to electrically couple the VRM 220 to the ASIC 230, as is described in more detail below in connection with FIG. 2. This electrical connection allows the VRM 220 to deliver power to the ASIC 230. For example, when mounted, the VRM 220 may receive input power at a standard intermediate voltage in the range of approximately 3V to approximately 54V, such as at approximately 12V. The VRM 220 may then regulate this power down to ASIC-specific voltages. In at least some embodiments, the ASIC-specific voltage may range from approximately 0.6V to approximately 0.9V. Since the VRM 120 is disposed close to the ASIC 230, the efficiency of the power transfer is significantly improved as compared to power transfers moving along (e.g., laterally through) a PCB plane.

More specifically, reducing the length of the power transfer path reduces the spreading resistance and spreading inductance, thereby increasing the efficiency. By comparison, traditional power delivery through the PCB results in significant losses (e.g., >5%) because the current must travel through the heavily perforated power planes in the BGA shadow. Additionally, during power transfer, the thermal load placed on the PCB 202 and the ASIC 230 may be significantly reduced because the voltage regulator module 220 may be configured to conduct a thermal load into a carrier (not shown) supporting the electrical apparatus 200 and/or ground planes in the PCB (so that it may be dissipated laterally). In some embodiments, the electrical apparatus 200 may be coupled to a carrier (e.g., a metal carrier) with a thermal interface material in order to conduct the thermal load to the carrier. By comparison, if a voltage regulator module is included atop of an ASIC, the thermal load must be dissipated by the ASIC or at least passed through the ASIC, thereby increasing the thermal load on the ASIC. Additionally, providing a voltage regulator atop or integrated with the ASIC may consume valuable real estate.

Figure 2:
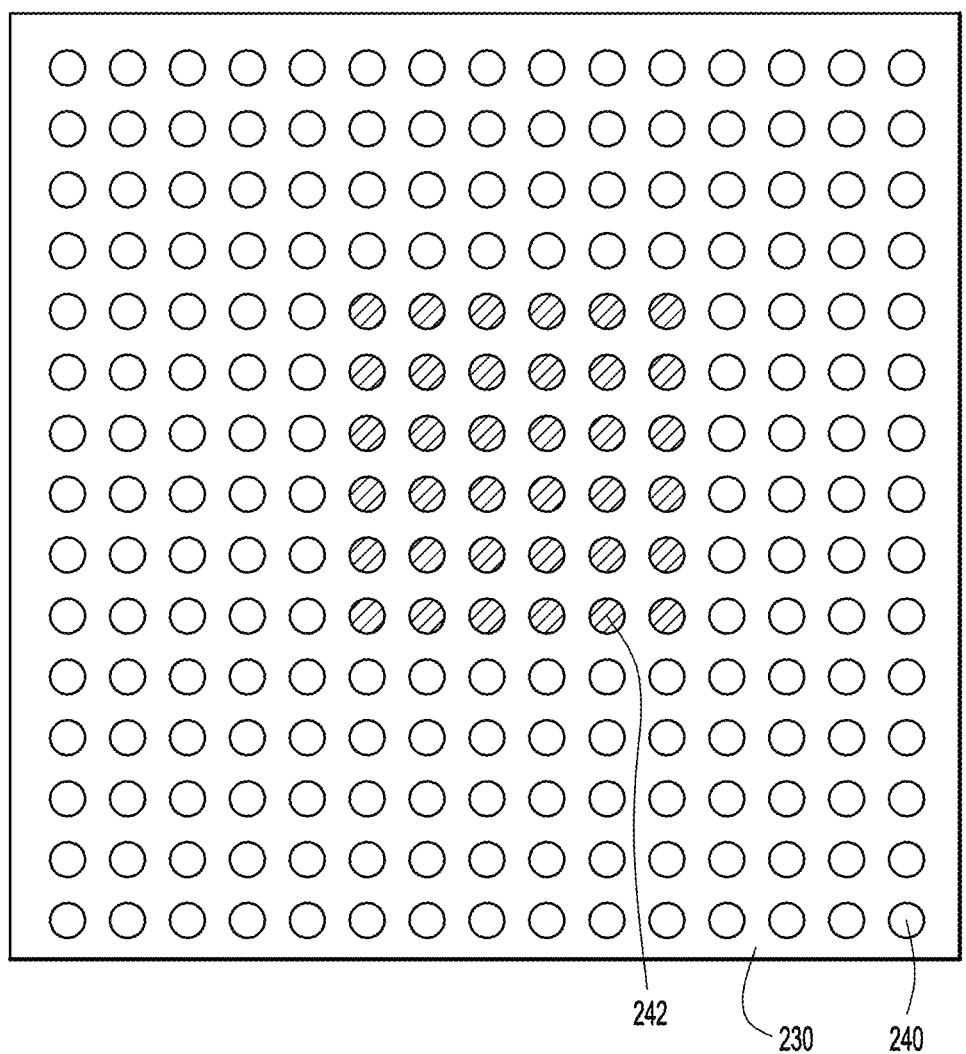
FIG. 2 is a bottom view of a ball grid array (BGA) included between a printed circuit board (PCB) and the ASIC in the apparatus of FIG. 1, according to an example embodiment.

Now referring to FIG. 2, a bottom view 300 of an example BGA configuration between the PCB 202 and the ASIC 230 included in FIG. 1 shows the electrical connection between the VRM 220 and the ASIC 230, according to an example embodiment. In this embodiment, the ASIC 230 is coupled to the PCB 202 at the BGA 240; however, the balls in the center of the array (denoted by 242) are depopulated and replaced with low profile land-side-caps to provide ultra high speed bypassing. Therefore, an annular BGA is achieved to provide a continuous array of low-voltage, high-current, power and ground connections while the center of the BGA is not used by the ASIC 230. Instead, the center region 242 of the BGA is repurposed to provide control signals (e.g., voltage querying, control, sequencing, etc.) and high voltage input (e.g., 12V) to the voltage regulator module 220 in the shadow of the depopulated balls. Consequently, if the voltage regulator module is the size of the power pin field in the ASIC, it will not interfere with the high-speed I/O located around the periphery of the ASIC package.

Figure 3:
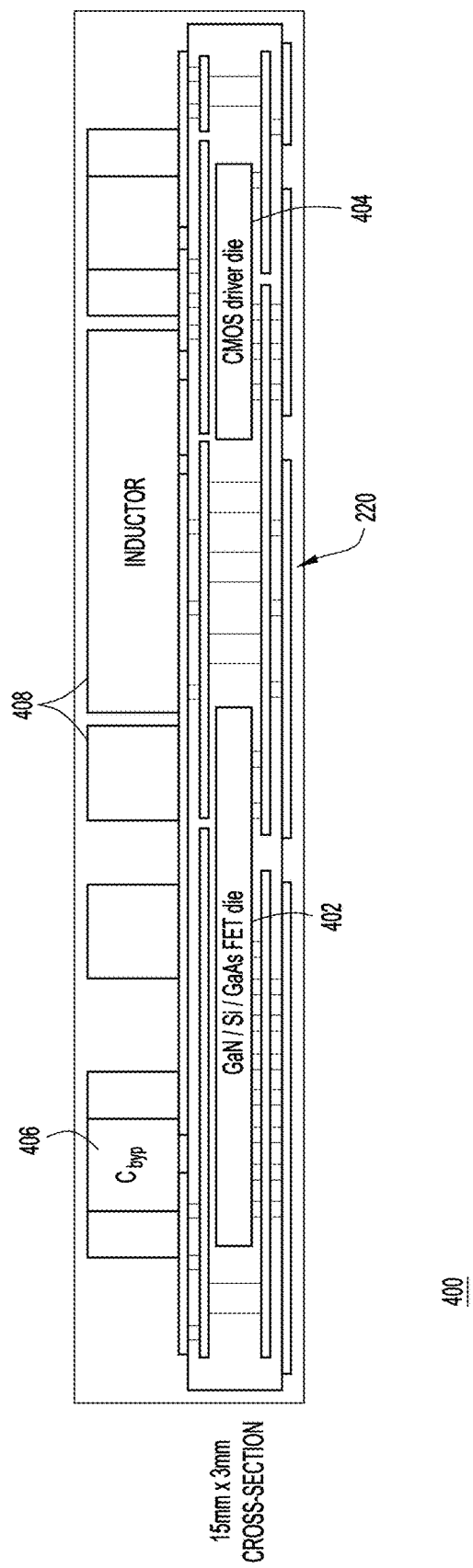
FIG. 3 is a combined sectional view and representative schematic diagram of a voltage regulator module included in the apparatus of FIG. 1, according to an example embodiment

Now referring to FIG. 3 for a description of an example VRM 220. Generally, the VRM 220 utilizes a compact high-frequency buck type converter to down-regulate intermediate input power (e.g., 12V power) to ASIC-specific voltages (e.g., 0.9V). In the depicted example, the VRM 220 includes multiple integrated power stages (effectuated by one or more gallium nitride (GaN), silicon (Si), and/or gallium arsenide (GaAs) field effect transistor (FET) die 402), a complementary metal-oxide-semiconductor (CMOS) driver die 404, bypass capacitors 406, as well as low profile power inductors and poly-phase power controllers (generally indicated at 408). In some embodiments, a GaAs FET is utilized because it provides significantly faster switching than a silicone transistor, thereby allowing for a reduction in the profile (e.g., size) of the VRM 220. However, these components are merely exemplary and, in other embodiments, other power stages and, in particular, power stages with low profile designs, may be used. For example, in certain devices, efficiency may be more important than thickness, and components may be chosen accordingly (e.g., the GaAs FET may be replaced). Generally, the frequency switching in the VRM 220 may occur at any frequency in the range of approximately 500 kHz to approximately 4 MHz.

Regardless of the components included in the VRM 220, the VRM 220 is configured to deliver one or more ASIC-specific voltages to an ASIC or portions thereof. For example, in one embodiment, the VRM 220 may deliver power to every component of an ASIC at 0.9V. However, in other embodiments, it may be more efficient to deliver power to different components or portions of an ASIC at N different voltages. For example, the VRM 220 may deliver power to the memory of an ASIC at 0.6V while delivering power to logic (e.g., a bit cell or microprocessor) included in an ASIC at 0.8V. In other words, the VRM 220 may deliver split rail power to an ASIC. Notably, this split rail mechanism can be implemented without additional planes to a PCB or otherwise using an increased amount of PCB area. Instead, the VRM 220 may utilize different portions of the electrical connection in the BGA to deliver different voltages.

Figure 4:
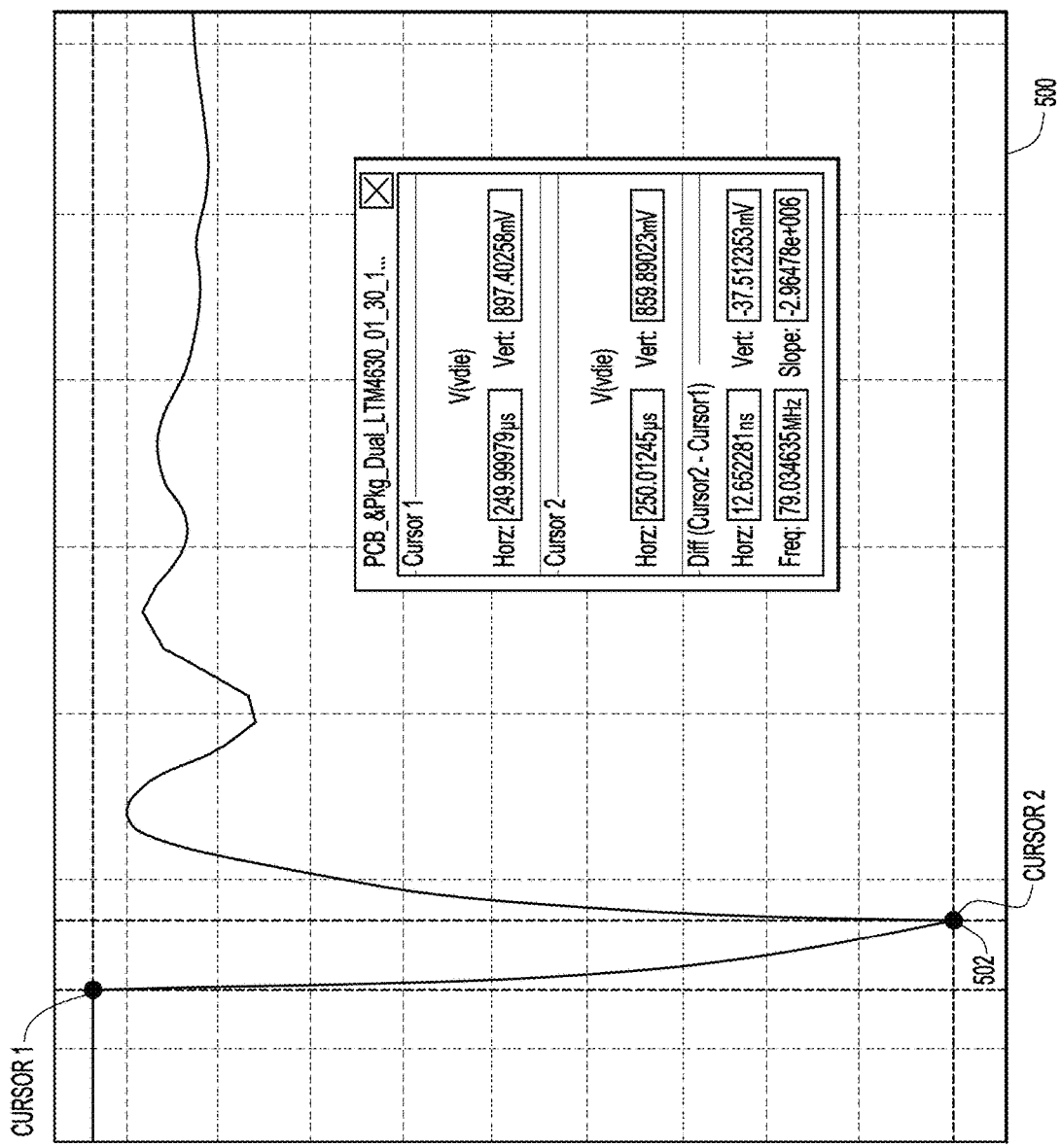
FIG. 4 is a diagram depicting voltage droop of an apparatus without enhanced power delivery.
Figure 5:
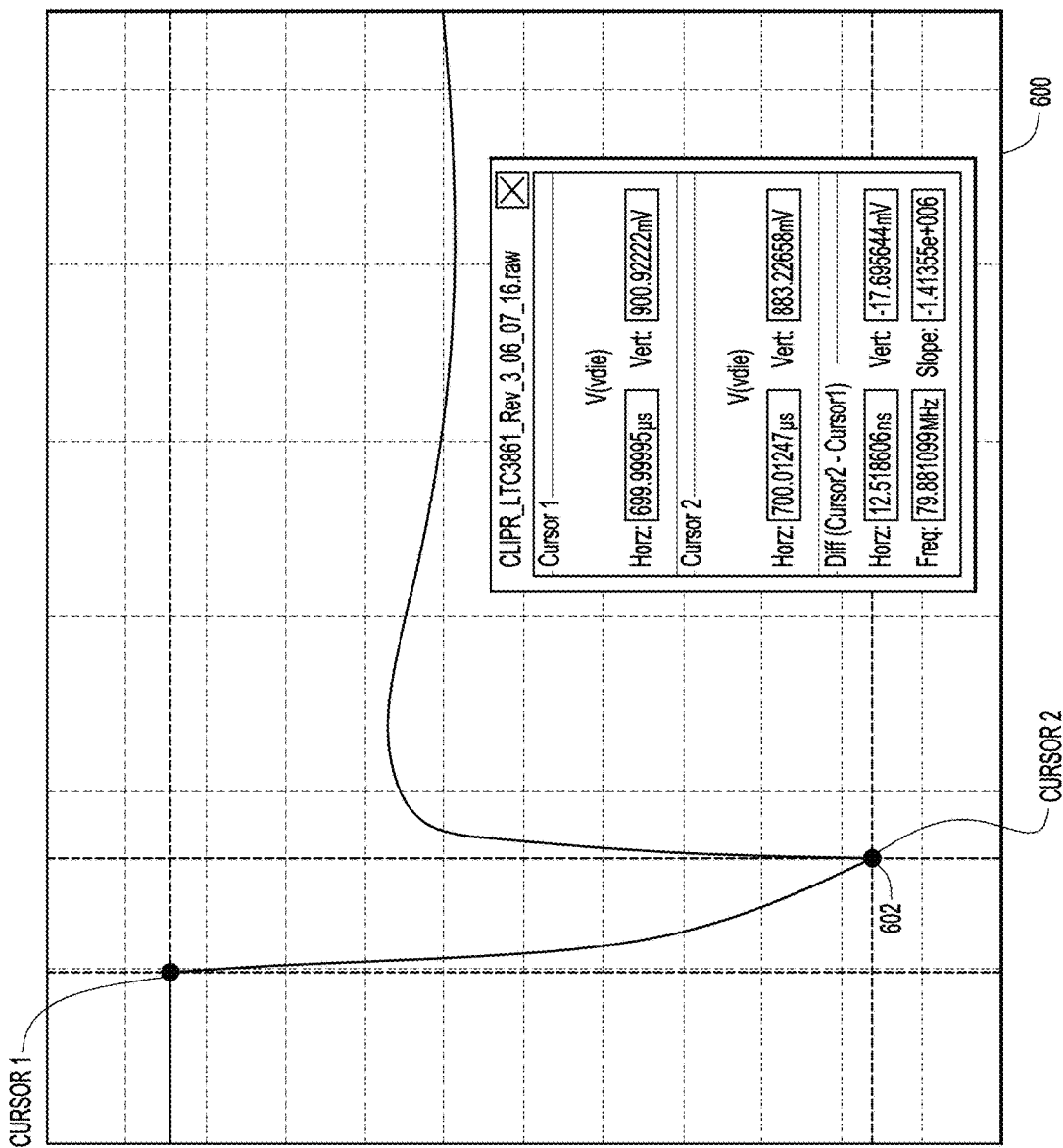
FIG. 5 is a diagram depicting voltage droop of an apparatus with enhanced power delivery to an ASIC, according to an example embodiment

Now referring to FIGS. 4 and 5, plots 500 and 600, respectively, illustrate the reduced voltage droop provided by the enhanced power distribution techniques presented herein, as compared to conventional designs. Plot 500 and plot 600 each show voltage over time for tests conducted at 17A for a rise time of 12.5 nS. In plot 500, an electrical apparatus without the enhanced power techniques provided herein experiences a voltage droop of 37.5 mV at the die bump, as indicated at 502. By comparison, in plot 600, an electrical apparatus with the enhanced power techniques presented herein only experiences a voltage droop of 17.7 mV at the die bump, as indicated at 602. Consequently, the techniques presented herein reduce voltage droop by nearly 53% which, in turn, may allow a 20 mV set-point reduction (e.g., power can be delivered at a rate 20 mV lower while still guarantee that requisite specifications are met). For example, if a standard DC set-point is 850 mv, the set-point can be reduced to 830 mv, which is a 5% power reduction.

Figure 6:
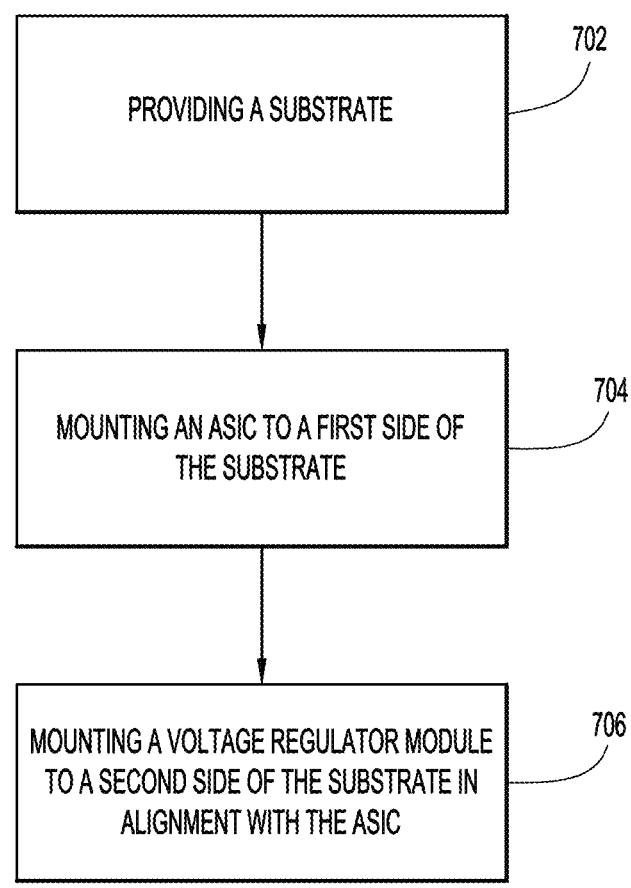
FIG. 6 is a flow chart illustrating a method for enhancing power delivery to an ASIC according to an example embodiment.

Now turning to FIG. 6, a flow chart 700 for an example method of enhancing power distribution to an ASIC in accordance with an example embodiment is shown. Initially, at step 702, a substrate, such as the PCB 202 shown in FIG. 1 and described above, is provided. At step 704, an ASIC is mounted to a first side, such as the top side, of the PCB. As described above, in some embodiments, the ASIC is mounted to the PCB by soldering with a BGA including an annular ring of conventional balls surrounding depopulated balls that are configured to provide control signals and high voltage input to a voltage regulation module. At step 706, the voltage regulation module is mounted to a second side of the substrate, such as the bottom of the PCB. The voltage regulator module is mounted in alignment (e.g., in the shadow of) the ASIC and the voltage regulator module and ASIC are electrically coupled together through a via included in the PCB. As mentioned above, in at least some embodiments, the via may be a preexisting via so that the PCB need not be modified to host this configuration.

Enhancing power distribution in accordance with examples presented herein may provide a number of advantages over conventional power distribution techniques (e.g., laterally through a power plane). Most notably, the power techniques provided herein increase distribution efficiency and reduce voltage droop, such that smaller amounts of power can be distributed to an ASIC while still satisfying any ASIC specifications (e.g., a lower voltage set-point can be selected). This, in turn, reduces static and dynamic power dissipation while also saving costs associated with providing a higher voltage set-point. For example, higher voltage PCB distribution virtually eliminates $I^2R$ dissipation in the PCB.

Moreover, the techniques presented herein reduce or eliminate power component real estate requirements, which may free up valuable area on a PCB and allow for increased density and reduced complexity (because the PCB power layer now only handles intermediate voltage distribution). The reduced complexity also resolves conflicts between signal integrity and power integrity. Locating a voltage regulator module beneath the PCB, in alignment with the ASIC, may also improve thermal load dissipation, since at least a portion of the thermal load may be conducted to a carrier. Still further, the techniques presented herein allow for simple and effective split rail power delivery, which may further increase the power efficiencies of an electrical apparatus. Also, these techniques achieve power integrity consistency. For example, these techniques eliminate slice-level dependence for power integrity analysis and slice-to-slice design variation (thereby reducing a potential cause during bring-up/debug).

In one form, an apparatus is provided comprising: a substrate with a first side, a second side, and a vertical interconnect access (via) extending between the first side and the second side; an application-specific integrated circuit (ASIC) mounted on the first side of the substrate in alignment with the via; and a voltage regulator module mounted on the second side of the substrate in alignment with the via so that the voltage regulator module is electrically coupled to the ASIC through the via.

In another form, a method is provided comprising: providing a substrate with a first side, a second side, and a vertical interconnect access (via) extending between the first side and the second side; mounting an application-specific integrated circuit (ASIC) on the first side of the substrate in alignment with the via; and mounting a voltage regulator module to the second side of the substrate in alignment with the via so that the voltage regulator module is electrically coupled to the ASIC through the via.

In still another form, an apparatus is provided comprising: a printed circuit board (PCB) with a preexisting vertical interconnect access (via); and a voltage regulator module integrated into the PCB in a shadow of an application-specific integrated circuit (ASIC) aligned with the preexisting via.

Although the techniques are illustrated and described herein as embodied in one or more specific examples, it is nevertheless not intended to be limited to the details shown, since various modifications and structural changes may be made within the scope and range of the claims.

What is claimed is:

1. An apparatus comprising:
   a substrate with a first side, a second side, and a vertical interconnect access (via) extending between the first side and the second side;
   an application-specific integrated circuit (ASIC) mounted on the first side of the substrate, in alignment with the via, with a ball grid array (BGA) associated with the via that includes a depopulated central section; and
   a voltage regulator module mounted on the second side of the substrate in alignment with the via so that the voltage regulator is electrically coupled to the ASIC through the via, wherein the depopulated central section of the BGA allows signals and input power to be delivered to the voltage regulator module.

2. The apparatus of claim 1, wherein the substrate is a printed circuit board (PCB) with a PCB stiffener.

3. The apparatus of claim 2, wherein the voltage regulator module is integrated into the PCB stiffener.

4. The apparatus of claim 1, wherein the voltage regulator module is mounted to the second side of the substrate with an elastomeric membrane.

5. The apparatus of claim 1, wherein the voltage regulator module is mounted to the second side of the substrate via soldering.

6. The apparatus of claim 1, wherein the voltage regulator module is configured to receive power at a standard intermediate voltage in a range of approximately 3 Volts (V) to approximately 54 V, regulate the power down to an ASIC-specific voltage in a range of approximately 0.6 V to approximately 0.9 V, and deliver power to the ASIC at the ASIC-specific voltage.

7. The apparatus of claim 6, wherein a first portion of the ASIC utilizes power at a first ASIC-specific voltage in a range of approximately 0.6 V to approximately 0.9 V, a second portion of the ASIC utilizes power at a second ASIC-specific voltage in a range of approximately 0.6 V to approximately 0.9 V, and the voltage regulator module is configured to deliver power to the first portion at the first ASIC-specific voltage and deliver power to the second portion at the second ASIC-specific voltage.

8. The apparatus of claim 1, wherein the voltage regulator module is separated from the ASIC by a distance comprising the height of the substrate.

9. An apparatus comprising:
   a printed circuit board (PCB) with a preexisting vertical interconnect access (via); and
   a voltage regulator module integrated into the PCB in a shadow of an application-specific integrated circuit (ASIC) that is aligned with the preexisting via, wherein the ASIC is mounted to the PCB with a ball grid array (BGA) that is associated with the preexisting via and that includes a depopulated central section that allows signals and input power to be delivered to the voltage regulator module.

10. The apparatus of claim 9, wherein the voltage regulator module is configured to receive power at a standard intermediate voltage in a range of approximately 3 Volts (V) to approximately 54 V, regulate the power down to one or more ASIC-specific voltages, each of which are in a range of approximately 0.6 V to approximately 0.9 V, and deliver power to the ASIC at each of the one or more ASIC-specific voltages.

11. The apparatus of claim 10, wherein a first portion of the ASIC utilizes power at a first ASIC-specific voltage in a range of approximately 0.6 V to approximately 0.9 V, a second portion of the ASIC utilizes power at a second ASIC-specific voltage in a range of approximately 0.6 V to approximately 0.9 V, and the voltage regulator module is configured to deliver power to the first portion at the first ASIC-specific voltage and delivers power to the second portion at the second ASIC-specific voltage.

12. The apparatus of claim 9, wherein the ASIC is disposed on a first side of the PCB, and the shadow is a space disposed on a second, opposite side of the PCB that is vertically aligned with the ASIC.

13. The apparatus of claim 9, wherein the PCB includes a PCB stiffener and the voltage regulator module is integrated into the PCB stiffener.

14. An apparatus comprising:
    a substrate with a first side and a second side;
    an application-specific integrated circuit (ASIC) mounted on the first side of the substrate with a ball grid array (BGA) that includes a depopulated central section; and
    a voltage regulator module mounted on the second side of the substrate in alignment with the ASIC, the voltage regulator module being electrically coupled to the ASIC through the substrate, wherein the depopulated central section of the BGA allows signals and input power to be delivered to the voltage regulator module.

15. The apparatus of claim 14, wherein the voltage regulator module is configured to receive power at a standard intermediate voltage in a range of approximately 3 Volts (V) to approximately 54 V, regulate the power down to one or more ASIC-specific voltages, each of which are in a range of approximately 0.6 V to approximately 0.9 V, and deliver power to the ASIC at each of the one or more ASIC-specific voltages.

16. The apparatus of claim 14, wherein the substrate is a printed circuit board (PCB) with a PCB stiffener and the voltage regulator module is integrated into the PCB stiffener.

17. The apparatus of claim 14, wherein the voltage regulator module is separated from the ASIC by a distance comprising the height of the substrate.

18. The apparatus of claim 14, wherein the substrate comprises:
    a vertical interconnect access (via) extending between the first side and the second side and both the ASIC and the voltage regulator module are aligned with the via.

19. The apparatus of claim 18, wherein the depopulated central section of the BGA is aligned with the via.

20. The apparatus of claim 15, wherein a first portion of the ASIC utilizes power at a first ASIC-specific voltage in a range of approximately 0.6 V to approximately 0.9 V, a second portion of the ASIC utilizes power at a second ASIC-specific voltage in a range of approximately 0.6 V to approximately 0.9 V, and the voltage regulator module is configured to deliver power to the first portion at the first ASIC-specific voltage and delivers power to the second portion at the second ASIC-specific voltage.

* * * * *